United States Patent
Cron

(10) Patent No.: US 11,231,462 B1
(45) Date of Patent: Jan. 25, 2022

(54) AUGMENTING AN INTEGRATED CIRCUIT (IC) DESIGN SIMULATION MODEL TO IMPROVE PERFORMANCE DURING VERIFICATION

(71) Applicant: Synopsys, Inc., Mountain View, CA (US)

(72) Inventor: Adam D. Cron, Hilton Head Island, SC (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 16/912,226

(22) Filed: Jun. 25, 2020

Related U.S. Application Data

(60) Provisional application No. 62/868,482, filed on Jun. 28, 2019.

(51) Int. Cl.
 *G01R 31/3177* (2006.01)
 *G01R 31/3181* (2006.01)
 *G01R 31/3185* (2006.01)

(52) U.S. Cl.
 CPC ... *G01R 31/3177* (2013.01); *G01R 31/31813* (2013.01); *G01R 31/318533* (2013.01); *G01R 31/318541* (2013.01); *G01R 31/318575* (2013.01)

(58) Field of Classification Search
 CPC .......... G01R 31/3177; G01R 31/31813; G01R 31/318533; G01R 31/318541; G01R 31/31857
 USPC ......... 714/726, 727, 729, 731; 716/106, 101
 See application file for complete search history.

(56) References Cited

U.S. PATENT DOCUMENTS

| | | | | |
|---|---|---|---|---|
| 5,513,187 A | * | 4/1996 | Zepp | G01R 31/318536 714/727 |
| 5,627,839 A | * | 5/1997 | Whetsel | G01R 31/318572 714/726 |
| 6,114,892 A | * | 9/2000 | Jin | G01R 31/318541 327/202 |
| 6,199,182 B1 | * | 3/2001 | Whetsel | G01R 31/31715 326/16 |
| 6,289,491 B1 | * | 9/2001 | Dupenloup | G06F 30/30 716/106 |
| 6,292,931 B1 | * | 9/2001 | Dupenloup | G06F 30/30 716/104 |

(Continued)

OTHER PUBLICATIONS

Alpaslan et al., On Reducing Scan Shift Activity at RTL, Jul. 2010, IEEE, vol. 29, No. 7, pp. 1110-1120. (Year: 2010).*

(Continued)

*Primary Examiner* — John J Tabone, Jr.
(74) *Attorney, Agent, or Firm* — Park, Vaughan, Fleming & Dowler LLP; Laxman Sahasrabuddhe

(57) ABSTRACT

An augmented simulation model can be created of an integrated circuit (IC) design by inserting a switch in a simulation model of the IC design between an output of a scan cell and an input of a combinational logic cloud. A simulation enable signal can be used to control the switch. Next, an IC design simulation environment can be generated based on the augmented simulation model. The IC design can be verified by using the IC design simulation environment. The simulation enable signal can be activated when the combinational logic cloud is desired to be simulated by the IC design simulation environment.

19 Claims, 5 Drawing Sheets

(56) References Cited

U.S. PATENT DOCUMENTS

| | | | | |
|---|---|---|---|---|
| 6,836,877 | B1* | 12/2004 | Dupenloup | G06F 30/30 716/103 |
| 7,319,343 | B2* | 1/2008 | Bhunia | G01R 31/31858 326/16 |
| 7,454,677 | B2* | 11/2008 | Whetsel | G01R 31/31715 714/726 |
| 8,890,563 | B2* | 11/2014 | Lin | G01R 31/318575 326/16 |
| 9,501,589 | B2* | 11/2016 | Lin | G06F 30/33 |
| 2006/0168489 | A1* | 7/2006 | Mitra | G01R 31/318541 714/724 |
| 2006/0220679 | A1* | 10/2006 | Bhunia | G01R 31/31858 326/38 |
| 2007/0260954 | A1* | 11/2007 | Wong | G01R 31/318575 714/733 |
| 2009/0106612 | A1* | 4/2009 | Pandey | G06F 11/267 714/727 |
| 2009/0300448 | A1* | 12/2009 | Tomita | G01R 31/318541 714/731 |
| 2011/0304353 | A1* | 12/2011 | Lee | H03K 19/003 326/16 |
| 2012/0043991 | A1* | 2/2012 | Lin | G01R 31/318575 326/16 |
| 2012/0068734 | A1* | 3/2012 | Sethuram | H03K 19/173 326/46 |
| 2012/0072793 | A1* | 3/2012 | Rao | G11C 29/32 714/719 |
| 2012/0272110 | A1* | 10/2012 | Rajski | G01R 31/31721 714/726 |
| 2013/0153896 | A1* | 6/2013 | Whetsel | H01L 23/481 257/48 |
| 2015/0040087 | A1* | 2/2015 | Lin | G01R 31/318575 716/109 |

OTHER PUBLICATIONS

Bhunia et al., Low-Power Scan Design Using First-Level Supply Gating, Mar. 2005, IEEE, vol. 13, No. 3, pp. 384-395. (Year: 2005).*

Bhunia et al., Power Reduction in Test-Per-Scan BIST with Supply Gating and Efficient Scan Partitioning, 2005, IEEE, pp. 1-6 (Year: 2005).*

Lin et al., Test Power Reduction by Blocking Scan Cell Outputs, 2008, IEEE, pp. 329-336. (Year: 2008).*

* cited by examiner

US 11,231,462 B1

AUGMENTING AN INTEGRATED CIRCUIT (IC) DESIGN SIMULATION MODEL TO IMPROVE PERFORMANCE DURING VERIFICATION

RELATED APPLICATION

This application claims benefit of U.S. Provisional Application Ser. No. 62/868,482, filed on 28 Jun. 2019, the contents of which are herein incorporated by reference in their entirety for all purposes.

TECHNICAL FIELD

The present disclosure generally relates to integrated circuit (IC) design, simulation, verification, and testing. More specifically, the present disclosure relates to augmenting an IC design simulation model to improve performance during verification.

BACKGROUND

The importance of verifying IC designs and testing IC chips cannot be over-emphasized. Indeed, it would be impossible to use IC chips in mission-critical devices and applications without thoroughly verifying IC designs and testing IC chips.

Advances in process technology and an almost unlimited appetite for computing and storage have fueled a rapid increase in the size and complexity of IC designs. Simultaneously, advancements in Automatic Test Pattern Generation (ATPG) have increased the complexity of patterns that are used during verification and test. Consequently, IC design verification may need a large amount of compute resources and may take a long time to complete. It is generally desirable to speed-up simulation of the IC design during verification.

BRIEF DESCRIPTION OF THE FIGURES

The disclosure can be understood based on the detailed description given below and the accompanying figures. The figures are for illustrative purposes, and do not limit the scope of the disclosure. Furthermore, the figures are not necessarily drawn to scale.

DETAILED DESCRIPTION

Figure 1:
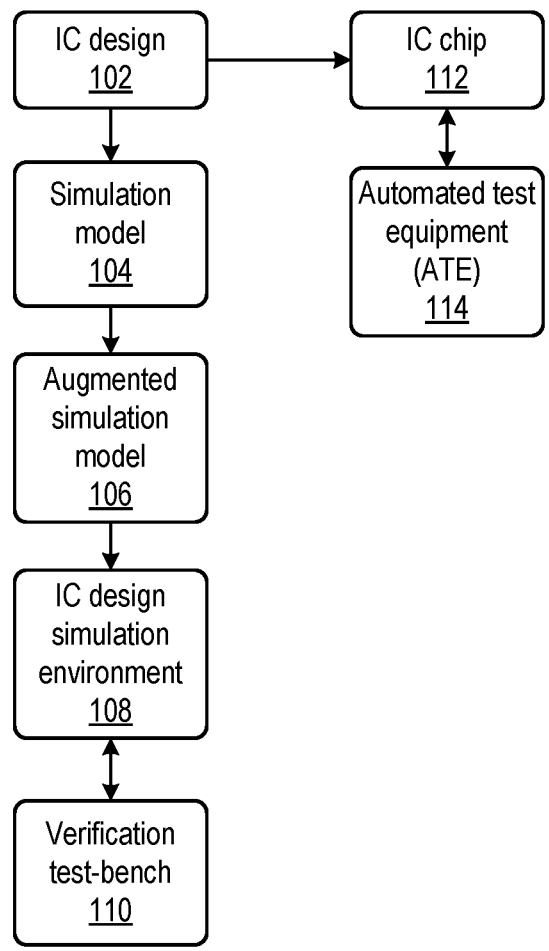
FIG. 1 illustrates a flow for using an augmented simulation model to speed-up verification in accordance with some embodiments described herein.

Design for test (DFT) circuitry can be included in IC chips to facilitate testing of IC chips. DFT circuitry typically includes scan chains that can be used to scan in test patterns and scan out responses. Each scan chain can include a chain of scan cells, and each scan cell can include a register (e.g., a flip-flop) and a multiplexer.

An IC chip that includes DFT circuitry can be operated in at least two operating modes—a normal operating mode and a test operating mode. In both operating modes, the scan cell registers can be used to hold values that are produced by combinational logic clouds in the IC chip during operation. In the test operating mode, the scan cell registers can additionally be used to scan in test patterns, and to scan out responses that are generated when the test patterns are applied to the IC chip.

The multiplexer in each scan cell can be used to couple the input of the scan cell register with either an output of a combinational logic cloud or an output of another scan cell register. Specifically, when the outputs of combinational logic clouds in the IC chip need to be captured, the input of a scan cell register can be coupled to the output of a combinational logic cloud that feeds the scan cell, and when test patterns need to be scanned in or responses need to be scanned out, the inputs and outputs of the scan cell registers can be coupled serially to form one or more scan chains.

After an IC design is manufactured and IC chips are produced, testing can be performed on the IC chips. However, the IC design is typically also verified before it is manufactured into IC chips. IC designs that include DFT circuitry can be verified by using simulation. Specifically, a simulation model for the IC design can be created, and the simulation model can be used to simulate the IC design. During simulation, test patterns (e.g., test patterns generated by using ATPG) can be applied to the IC design simulation, and responses generated by the IC design simulation can be compared with expected responses to verify the IC design. Note that the same set of test patterns that are used for verifying the IC design using simulation can also be used later to test the IC chip.

When test patterns are scanned in or scanned out, the IC design simulation may continue to simulate the combinational logic clouds in the IC design. However, this computation may be unnecessary because the output produced by combinational logic clouds may be ignored when test patterns are scanned in or scanned out. On the other hand, some ATPG patterns may need to load values into non-scan-cell flip-flops (i.e., FFs that are not in scan chains). In such situations, the IC design simulation may need to simulate the operation of combinational logic clouds while data is being scanned into the scan cells, so that the appropriate data bits are loaded into the non-scan-cell FFs. An IC design simulation can waste computational resources if it simulates the combinational logic clouds during scan-in or scan-out operations when the outputs of the combinational logic clouds are being ignored. On the other hand, the IC design simulation may not allow certain ATPG tests to be correctly performed if the IC design simulation does not simulate combinational logic clouds during scan-in or scan-out operations, but ATPG test requires the combinational logic clouds to be simulated during scan-in operations.

Embodiments described in this disclosure can insert a switch between an output of a scan cell and an input of a combinational logic cloud that is electrically connected to the scan cell output. The inserted switch can be controlled by a simulation enable signal. A test-bench can use the simulation enable signal to selectively turn-off and turn-on simulation of a combinational logic cloud during verification.

Advantages of embodiments disclosed herein include, but are not limited to, avoiding wasteful computation by turning-off simulation of combinational logic clouds during scan-in or scan-out operations when the outputs of the combinational logic clouds are being ignored, and allowing ATPG patterns to be used during verification that require simulation of the combinational logic clouds during scan-in operations.

FIG. 1 illustrates a flow for using an augmented simulation model to speed-up verification in accordance with some embodiments described herein. IC design 102 can be used to generate a taped-out IC design, which can then be manufactured to produce IC chip 112 (further details of this process are described in reference to FIG. 4 below). IC chip 112 can be tested by using automated test equipment (ATE) 114. The functionality of IC design 102 is usually verified before IC chips 112 are manufactured.

Specifically, simulation model 104 can be generated based on IC design 102. Embodiments described herein can create augmented simulation model 106 based on simulation model 104. Note that both simulation model 104 and augmented simulation model 106 simulate the behavior of IC chip 112; however, augmented simulation model 106 can include features (described below) that can speed-up simulation during verification. In some embodiments, simulation model 104 and augmented simulation model 106 can be represented using a hardware description language (HDL). In some embodiments, simulation model 104 and augmented simulation model 106 can be represented as netlists.

IC design simulation environment 108 can be generated based on augmented simulation model 106. In some embodiments, IC design simulation environment 108 can include executable code that can be executed on a computer or interpreted by an interpreter executing on the computer where the executable code encodes the behavior of IC design 102. In addition to the executable code, simulation environment 108 can also include other processes or files that are used during simulation. In some embodiments, augmented simulation model 106 can be converted into software code which can be either executed on a processor (e.g., after the software code has been compiled to produce an executable for the processor) or interpreted by using an interpreter that executes on the processor.

IC design simulation environment 108 can then be used to verify IC design 102. Specifically, verification test-bench 110 can be used to apply test patterns to IC design simulation environment 108, and collect responses generated by IC design simulation environment 108. Next, verification test-bench 110 can verify IC design 102 based on comparing the responses generated by IC design simulation environment 108 with the responses that are expected to be generated by an error-free IC chip.

In some embodiments, augmented simulation model 106 can be created by inserting a switch in simulation model 104 between an output of a scan cell and an input of a combinational logic cloud. Specifically, a switch can be inserted at the output of each scan cell (as explained in reference to FIG. 2A below) in a set of scan cells in simulation model 104 to obtain augmented simulation model 106. A simulation enable signal can be used to control the switch. During verification, verification test-bench 110 can use the simulation enable signal to cause IC design simulation environment 108 to skip simulation of combinational logic clouds when the combinational logic clouds do not need to be simulated. The same simulation enable signal can be provided to each switch (i.e., test-bench 110 can use a single simulation enable signal to control all switches), or different simulation enable signals can be provided to different switches (i.e., test-bench 110 can use multiple simulation enable signals to independently control individual switches or groups of switches).

Specifically, test-bench 110 can activate the simulation enable signal either (1) when the scan enable signal is deactivated, or (2) prior to when the scan enable signal is deactivated. In particular, the switch can provide the output of the scan cell to the input of the combinational logic cloud when the simulation enable signal is active (i.e., the switch is closed), and can provide an indeterminate value (i.e., an "X" value) to the input of the combinational logic cloud when the simulation enable signal is inactive (i.e., the switch is open).

According to one definition, a variable (which can represent a signal in the IC design) has an "indeterminate" value if the variable's value is not known, i.e., the variable can be either a "0" or a "1." Note that an indeterminate value can be interpreted as a "don't care" value. Providing an "X" value in a given clock cycle to the input of a combinational logic cloud can cause the IC design simulation environment 108 to skip the simulation of the "X" value through the combinational logic cloud in that clock cycle. In this manner, verification test-bench 110 can use the simulation enable signal to speed-up simulation of IC design 102 during verification.

Figure 2A:
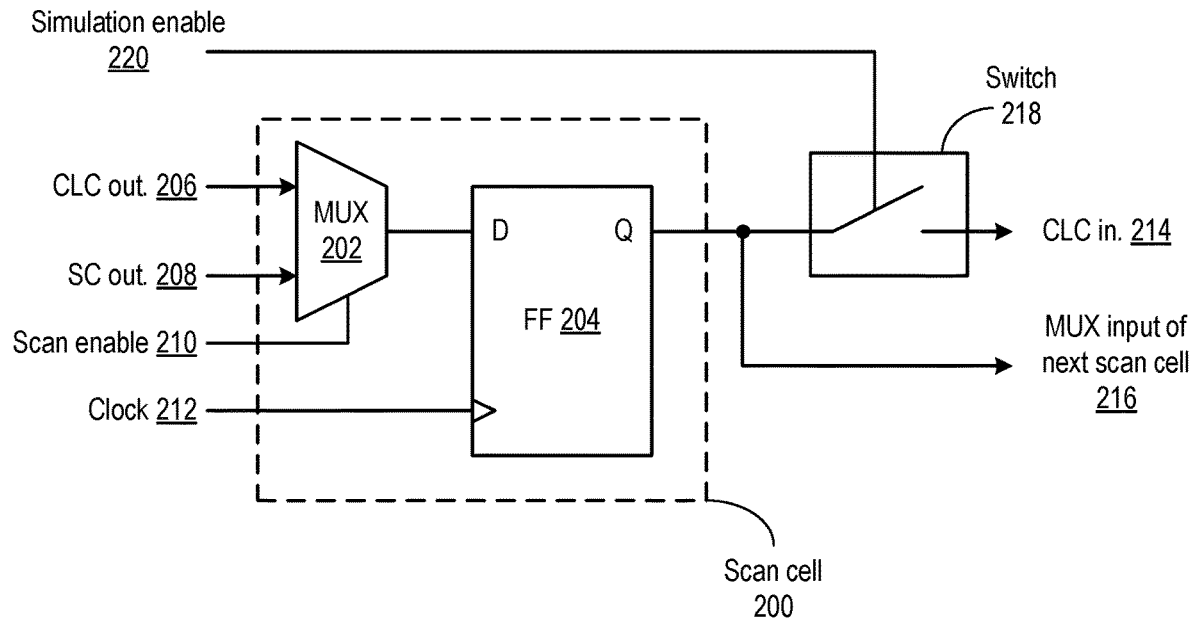
FIG. 2A illustrates an augmented simulation model of a portion of an IC design in accordance with some embodiments described herein.

FIG. 2A illustrates an augmented simulation model of a portion of an IC design in accordance with some embodiments described herein. Scan cell 200 can include multiplexer 202 and flip-flop (FF) 204. The "Q" output of FF 204 can also be the output of scan cell 200. Multiplexer 202 can receive two inputs: the output of a combinational logic cloud 206, and the output of a previous scan cell 208 in the scan chain.

In this disclosure, the term "combinational logic cloud" can refer to a network of combinational logic cells (e.g., OR cells, AND cells, NOT cells, etc.) that implement a logic function. Note that an IC design can be viewed as a set of FFs that are coupled to one another through combinational logic clouds.

Scan enable signal 210 can be used to select an input of multiplexer 202. Specifically, when scan enable signal 210 is active, the output from the previous scan cell 208 is coupled to the "D" input of FF 204, thereby allowing data to be scanned-in or scanned-out using the scan chains. When scan enable signal 210 is inactive, the output 206 signal from the combinational logic cloud 206 is coupled to the "D" input of FF 204, thereby allowing the output signal from the combinational logic cloud 206 to be captured based on clock 212.

In simulation model 104 (see FIG. 1), the output "Q" of FF 204 can be electrically coupled to the input of the next combinational logic cloud 214 and also to a multiplexer input of the next scan cell 216 in the scan chain. As shown in FIG. 2A, in augmented simulation model 106, switch 218 can be inserted between the output "Q" of FF 204 and the input of the next combinational logic cloud 214. Switch 218 can be controlled by simulation enable signal 220. When simulation enable signal 220 is active, switch 218 can be closed, and the output "Q" of FF 204 can be electrically coupled to the input of the next combinational logic cloud 214. In other words, when simulation enable signal 220 is active, the output value at output "Q" of FF 204 can be provided to the input of the next combinational logic cloud 214. However, when simulation enable signal 220 is inactive, switch 218 can be open, and the output "Q" of FF 204 can be electrically disconnected from the input of the next combinational logic cloud 214. Specifically, when simulation enable signal 220 is inactive, an indeterminate value ("X") can be provided to the input of the next combinational logic cloud 214.

Figure 2B:
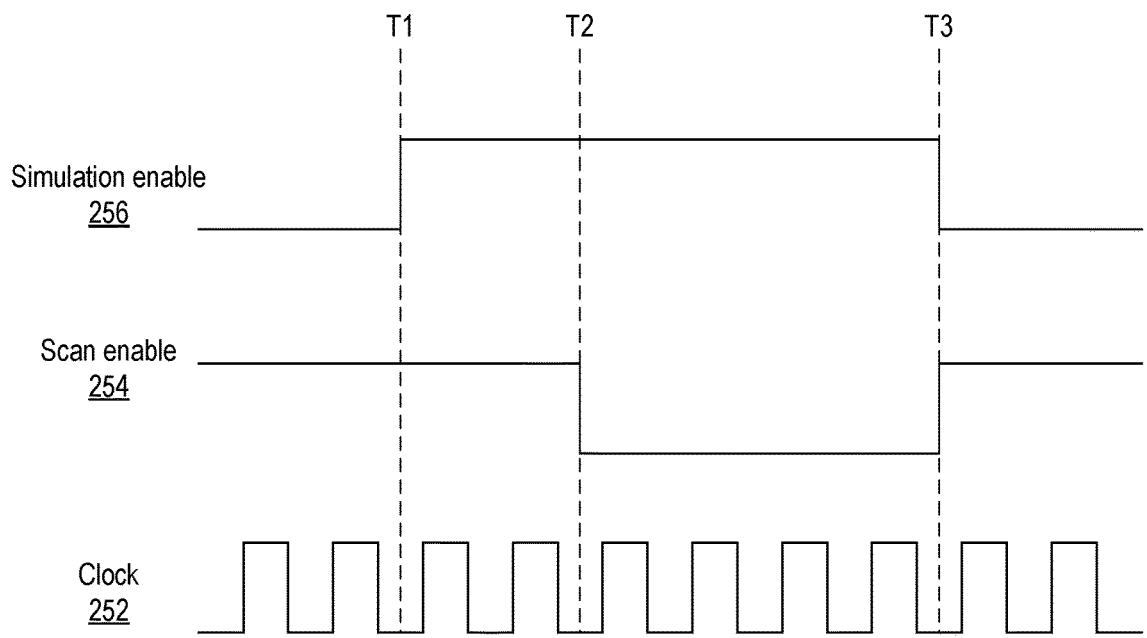
FIG. 2B illustrates timing waveforms for an augmented simulation model in accordance with some embodiments described herein.

FIG. 2B illustrates timing waveforms for an augmented simulation model in accordance with some embodiments described herein. Clock waveform 252 can correspond to clock 212, scan enable waveform 254 can correspond to scan enable 210, and simulation enable waveform 256 can correspond to simulation enable 220. As shown in scan enable waveform 254, scan enable 210 is active prior to time instance T2 and after time instance T3. However, between time instances T2 and T3, scan enable 254 is inactive. Accordingly, test patterns can be scanned into the scan chains, and simultaneously response values can be scanned out of the scan chains prior to time instance T2 and after time instance T3. Between time instances T2 and T3, the test patterns can be applied to the IC design, i.e., the IC design can be clocked to generate response values based on the test patterns that were scanned in.

As shown in simulation enable waveform 256, simulation enable 220 is inactive prior to time instance T1 and after time instance T3. However, simulation enable 220 is active between time instances T1 and T3. In other words, switch 218 can be open before time instance T1 and after time instance T3, and be closed between time instances T1 and T3. Accordingly, switch 218 can provide an X value to the input of combinational logic cloud 214 before time instance T1 and after time instance T3. However, between time instances T1 and T3, switch 218 is closed, and provides the value at output "Q" of FF 204 to the input of combinational logic cloud 214.

The time instance when simulation enable is activated can coincide with the time instance when scan enable is deactivated; this timing pattern is not shown in FIG. 2B. Alternatively, as shown in FIG. 2B, the time instance when simulation enable is activated (i.e., time instance T1 in FIG. 2B) can be before the time instance when scan enable is deactivated (i.e., time instance T2 in FIG. 2B). Specifically, the simulation enable signal can be activated (e.g., by test-bench 110) at a predetermined or specified number of clock cycles prior to when the scan enable signal is deactivated.

As noted above, an IC design can be viewed as a set of FFs that are coupled to one another through combinational logic clouds. Typically, the scan cell FFs are a fraction of the total number of FFs in the IC design. Some ATPG patterns may need to load values into non-scan-cell FFs (i.e., FFs that are not in scan chains). In such situations, the IC design simulation environment 108 (see FIG. 1) may need to simulate the operation of combinational logic clouds while data is being scanned into the scan cells, so that the appropriate data bits are loaded into the non-scan-cell FFs. However, when the combinational logic clouds are not needed to be simulated, then the system should be able to skip such simulation operations.

Inserting switch 218 into the simulation model allows verification test-bench 110 to control when IC design simulation environment 108 simulates the combinational logic clouds in the IC design independently of the value of the scan enable signal 210. Specifically, verification test-bench 110 can deactivate the simulation enable signal 220 to cause IC design simulation environment 108 to skip simulation of combinational logic cloud 214 when simulation of the combinational logic cloud 214 is not needed, thereby speeding-up IC design simulation during verification.

Figure 3:
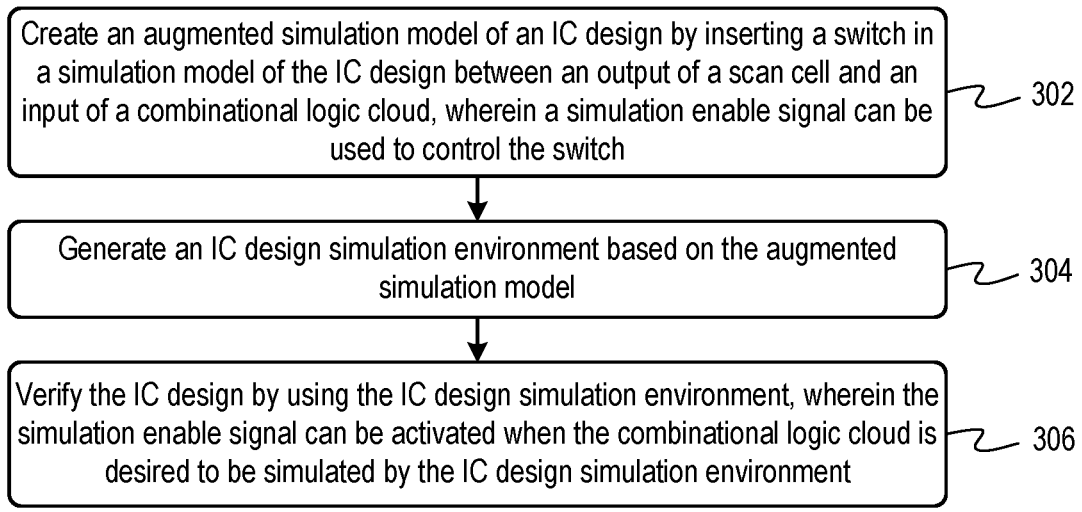
FIG. 3 illustrates a process for speeding-up simulation during verification in accordance with some embodiments described herein.

FIG. 3 illustrates a process for speeding-up simulation during verification in accordance with some embodiments described herein. The process can begin by creating an augmented simulation model of an IC design by inserting a switch in a simulation model of the IC design between an output of a scan cell and an input of a combinational logic cloud where a simulation enable signal can be used to control the switch (step 302). For example, the switch may be inserted into the augmented simulation model by modifying the HDL of the simulation model of the IC design to include the switch.

Note that the IC design can include scan chains, and each scan chain can include one or more scan cells. A scan enable signal can be used to scan in or scan out data in the scan chains. Also, note that the simulation enable signal is distinct from the scan enable signal. Additionally, note that the switch (e.g., switch 218) is present in augmented simulation model 106, but is not present in IC design 102, nor is the switch present in IC chip 112. Simulation enable signal 220 that controls switch 218 can be used by verification test-bench 110 to speed-up simulation of IC design simulation environment 108.

In some embodiments, the process can trace the scan path in simulation model 104 to identify scan cell outputs (e.g., the "Q" output of FF 204). Next, the process can insert a switch between the identified scan cell outputs and the combinational logic cloud that is electrically coupled to the scan cell outputs (e.g., between the "Q" output of FF 204 and combinational logic cloud input 214).

Referring to FIG. 3, the process can generate an IC design simulation environment based on the augmented simulation model (step 304). The process can then verify the IC design by using the IC design simulation environment, where the simulation enable signal can be activated when the combinational logic cloud is desired to be simulated by the IC design simulation environment (step 306). Specifically, the simulation enable signal can be activated either (1) when the scan enable signal is deactivated, or (2) prior to when the scan enable signal is deactivated. Activating a signal can correspond to transitioning the voltage of the signal from a first value to a second value, and deactivating the signal can correspond to transitioning the voltage of the signal from the second value to the first value.

Figure 4:
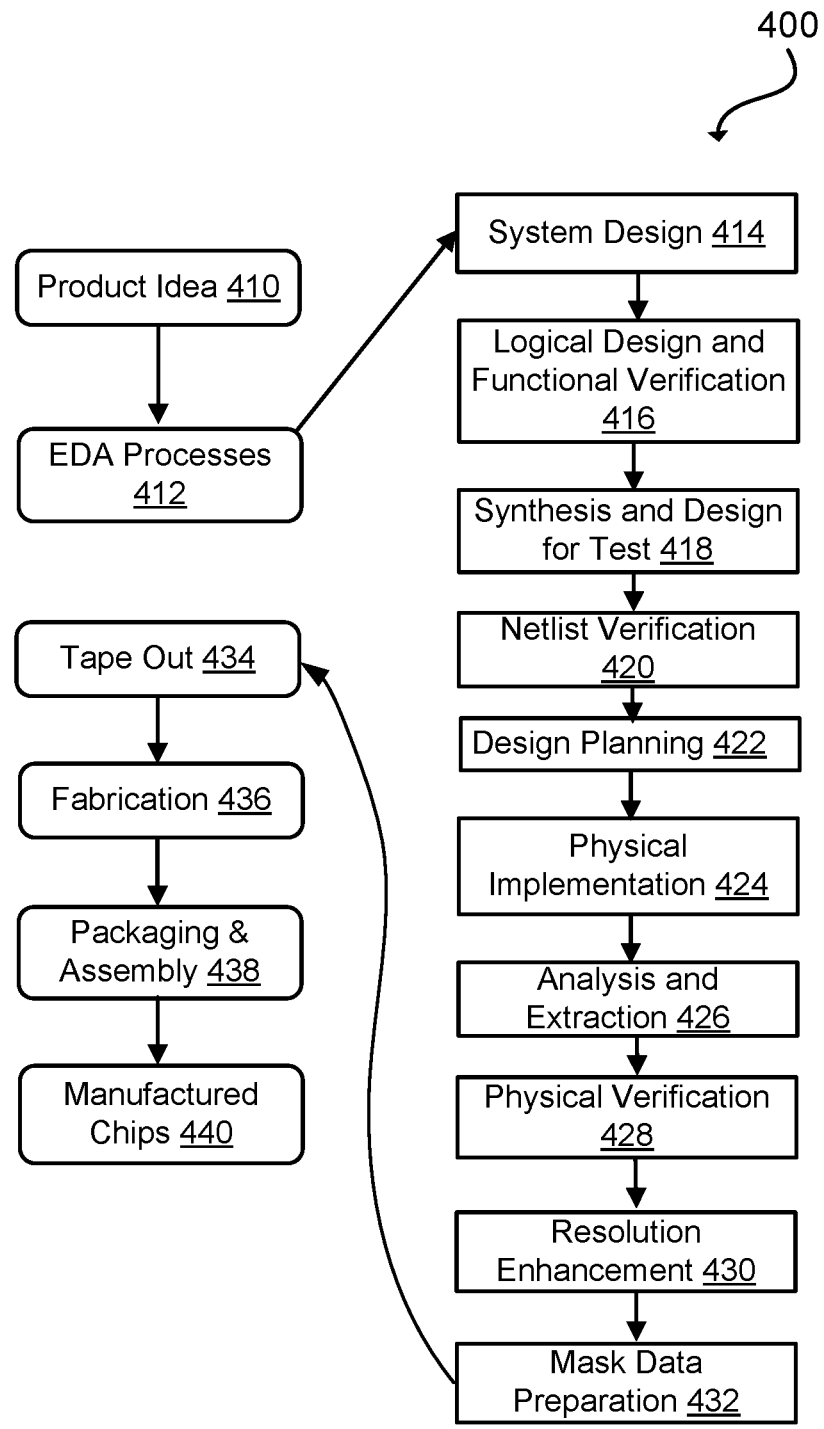
FIG. 4 depicts a flowchart that illustrates an IC design and manufacture flow in accordance with some embodiments described herein.

FIG. 4 illustrates an example flow 400 for the design, verification, and fabrication of an integrated circuit in accordance with some embodiments described herein. EDA processes 412 (the acronym "EDA" refers to "Electronic Design Automation") can be used to transform and verify design data and instructions that represent the integrated circuit. Each of these processes can be structured and enabled as multiple modules or operations.

Flow 400 can start with the creation of a product idea 410 with information supplied by a designer, information which is transformed and verified by using EDA processes 412. When the design is finalized, the design is taped-out 434, which is when artwork (e.g., geometric patterns) for the integrated circuit is sent to a fabrication facility to manufacture the mask set, which is then used to manufacture the integrated circuit. After tape-out, a semiconductor die is fabricated 436 and packaging and assembly 438 are performed to produce the manufactured IC chip 440.

Specifications for a circuit or electronic structure may range from low-level transistor material layouts to high-level description languages. A high-level of abstraction may be used to design circuits and systems, using a hardware description language ("HDL") such as VHDL, Verilog, SystemVerilog, SystemC, MyHDL or OpenVera. The HDL description can be transformed to a logic-level register transfer level ("RTL") description, a gate-level description, a layout-level description, or a mask-level description. Each lower abstraction level that is a less abstract description adds more detail into the design description. The lower levels of abstraction that are less abstract descriptions can be generated by a computer, derived from a design library, or created by another design automation process. An example of a specification language at a lower level of abstraction language for specifying more detailed descriptions is SPICE (which stands for "Simulation Program with Integrated Circuit Emphasis"). Descriptions at each level of abstraction contain details that are sufficient for use by the corresponding tools of that layer (e.g., a formal verification tool).

During system design 414, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 416, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as test-bench generators, static HDL checkers, and formal verifiers. In some embodiments, special systems of components referred to as 'emulators' or 'prototyping systems' are used to speed up the functional verification.

During synthesis and design for test 418, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 420, the netlist is checked for compliance with timing constraints and for correspondence with the HDL code. During design planning 422, an overall floor plan for the integrated circuit is constructed and analyzed for timing and top-level routing.

During layout or physical implementation 424, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flip-flop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 426, the circuit function is verified at the layout level, which permits refinement of the layout design. During physical verification 428, the layout design is checked to ensure that manufacturing constraints are correct, such as DRC constraints, electrical constraints, lithographic constraints, and that circuitry function matches the HDL design specification. During resolution enhancement 430, the geometry of the layout is transformed to improve how the circuit design is manufactured.

During tape-out, data is created to be used (after lithographic enhancements are applied if appropriate) for production of lithography masks. During mask data preparation 432, the 'tape-out' data is used to produce lithography masks that are used to produce finished integrated circuits.

A storage subsystem of a computer system (such as computer system 500 in FIG. 5) may be used to store the programs and data structures that are used by some or all of the EDA products described herein, and products used for development of cells for the library and for physical and logical design that use the library.

Figure 5:
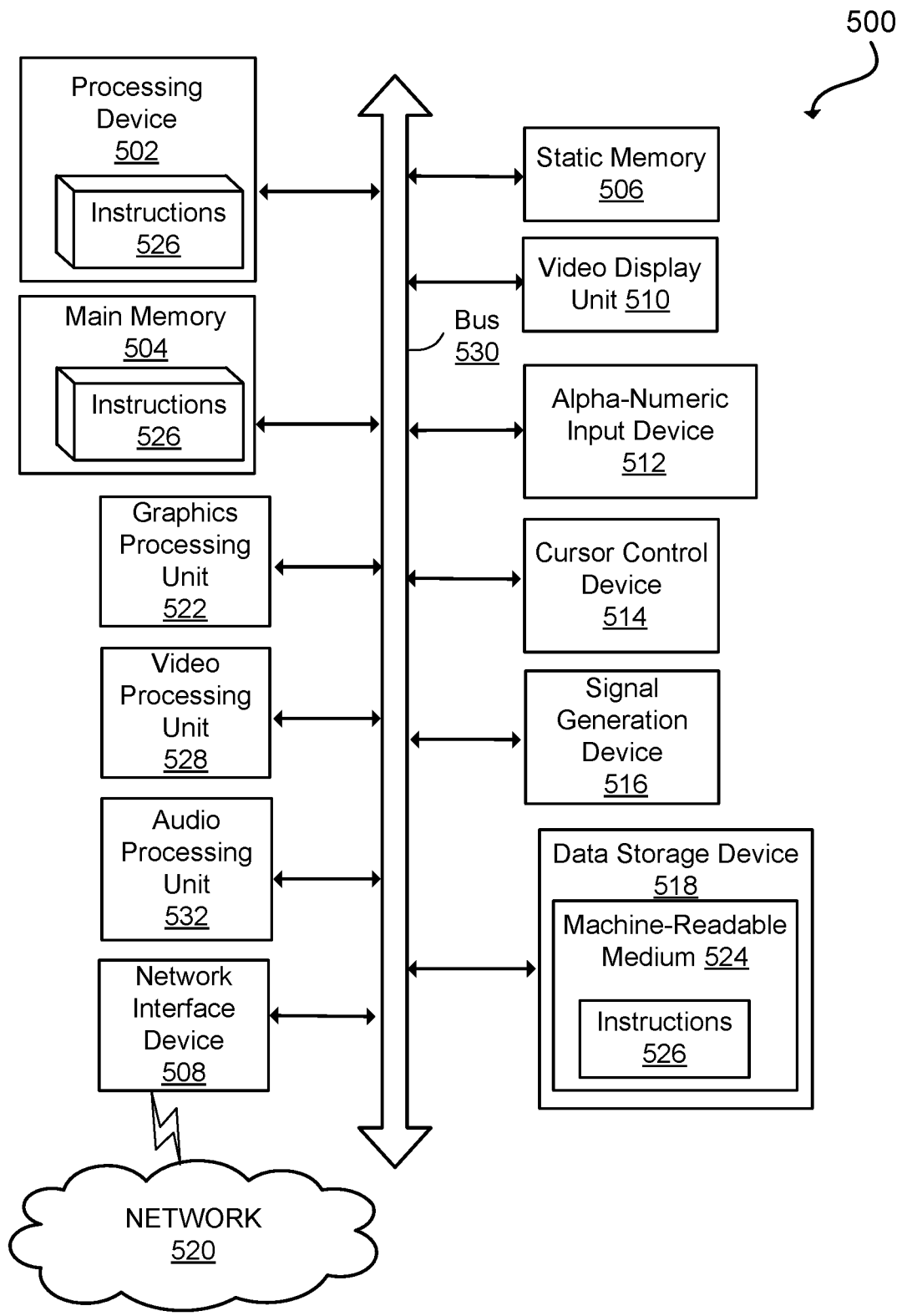
FIG. 5 illustrates an example machine of a computer system within which a set of instructions, for causing the machine to perform any one or more of the methodologies discussed herein, may be executed in accordance with some embodiments described herein.

FIG. 5 illustrates an example machine of a computer system 500 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM), a static memory 506 (e.g., flash memory, static random access memory (SRAM), etc.), and a data storage device 518, which communicate with each other via a bus 530.

Processing device 502 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 may also be one or more special-purpose processing devices such as an application specific integrated circuit (ASIC), a field programmable gate array (FPGA), a digital signal processor (DSP), network processor, or the like. The processing device 502 may be configured to execute instructions 526 for performing the operations and steps described herein.

The computer system 500 may further include a network interface device 508 to communicate over the network 520. The computer system 500 also may include a video display unit 510 (e.g., a liquid crystal display (LCD) or a cathode ray tube (CRT)), an alphanumeric input device 512 (e.g., a keyboard), a cursor control device 514 (e.g., a mouse), a graphics processing unit 522, a signal generation device 516 (e.g., a speaker), graphics processing unit 522, video processing unit 528, and audio processing unit 532.

The data storage device 518 may include a machine-readable storage medium 524 (also known as a non-transitory computer-readable medium) on which is stored one or more sets of instructions 526 or software embodying any one or more of the methodologies or functions described herein. The instructions 526 may also reside, completely or at least partially, within the main memory 504 and/or within the processing device 502 during execution thereof by the computer system 500, the main memory 504 and the processing device 502 also constituting machine-readable storage media.

In some implementations, the instructions 526 include instructions to implement functionality corresponding to the present disclosure. While the machine-readable storage medium 524 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 502 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method, comprising:
creating an augmented simulation model of an integrated circuit (IC) design by inserting a switch in a simulation model of the IC design between an output of a scan cell and an input of a combinational logic cloud, wherein a simulation enable signal is used to control the switch, wherein the IC design includes scan chains, wherein each scan chain includes one or more scan cells, wherein a scan enable signal is used to scan in or scan out data in the scan chains, wherein the switch provides the output of the scan cell to the input of the combinational logic cloud when the simulation enable signal is active, and wherein the switch provides an indeterminate value to the input of the combinational logic cloud when the simulation enable signal is inactive;
generating, by a processor, an IC design simulation environment based on the augmented simulation model; and
verifying the IC design by using the IC design simulation environment, wherein the simulation enable signal is activated when the combinational logic cloud is desired to be simulated by the IC design simulation environment.

2. The method of claim 1, wherein the simulation enable signal is deactivated when the scan enable signal is activated.

3. The method of claim 1, wherein the simulation enable signal is activated at a specified number of clock cycles prior to when the scan enable signal is deactivated.

4. The method of claim 1, wherein the simulation model and the augmented simulation model are represented using a hardware description language (HDL).

5. The method of claim 1, wherein the simulation model and the augmented simulation model are represented as netlists.

6. The method of claim 1, wherein the IC design simulation environment includes executable code that is either executed or interpreted on a computer.

7. A non-transitory storage medium storing instructions that, when executed by a processor, cause the processor to:
    identify an output of a scan cell in a simulation model of an integrated circuit (IC) design, wherein the output of the scan cell is electrically coupled to an input of a combinational logic cloud; and
    insert a switch in the simulation model of the IC design between the output of the scan cell and the input of a combinational logic cloud, wherein the switch provides the output of the scan cell to the input of the combinational logic cloud when a simulation enable signal is active, and wherein the switch provides an indeterminate value to the input of the combinational logic cloud when the simulation enable signal is inactive.

8. The non-transitory storage medium of claim 7, wherein the simulation enable signal is deactivated when a scan enable signal is activated.

9. The non-transitory storage medium of claim 7, wherein the simulation enable signal is activated at a predetermined number of clock cycles prior to when a scan enable signal is deactivated.

10. The non-transitory storage medium of claim 7, wherein the simulation model is represented using a hardware description language (HDL).

11. The non-transitory storage medium of claim 7, wherein the simulation model is represented as a netlist.

12. The non-transitory storage medium of claim 7, wherein an IC design simulation environment is generated based on the simulation model of the IC design with the switch, wherein the IC design simulation environment includes executable code that is either executed or interpreted on a computer.

13. The non-transitory storage medium of claim 7, wherein the IC design includes scan chains, wherein each scan chain includes one or more scan cells, wherein a scan enable signal is used to scan in or scan out data in the scan chains, and wherein the simulation enable signal is activated or deactivated based on the scan enable signal.

14. An apparatus, comprising:
    a memory storing instructions; and
    a processor, coupled with the memory and to execute the instructions, the instructions when executed causing the processor to:
        create an augmented simulation model of an integrated circuit (IC) design by inserting a switch in a simulation model of the IC design between an output of a scan cell and an input of a combinational logic cloud, wherein a simulation enable signal is used to control the switch, wherein the switch provides the output of the scan cell to the input of the combinational logic cloud when the simulation enable signal is active, and wherein the switch provides an indeterminate value to the input of the combinational logic cloud when the simulation enable signal is inactive;
        generate an IC design simulation environment based on the augmented simulation model; and
        verify the IC design by using the IC design simulation environment, wherein the simulation enable signal is activated when the combinational logic cloud is desired to be simulated by the IC design simulation environment.

15. The apparatus of claim 14, wherein the simulation enable signal is deactivated when a scan enable signal corresponding to the scan cell is activated.

16. The apparatus of claim 14, wherein the simulation enable signal is activated at a predetermined number of clock cycles prior to when a scan enable signal corresponding to the scan cell is deactivated.

17. The apparatus of claim 14, wherein the simulation model and the augmented simulation model are represented using a hardware description language (HDL).

18. The apparatus of claim 14, wherein the simulation model and the augmented simulation model are represented as netlists.

19. The apparatus of claim 14, wherein the IC design simulation environment includes executable code that is either executed or interpreted on a computer.

* * * * *